(12) United States Patent
Dong et al.

(10) Patent No.: US 9,178,529 B2
(45) Date of Patent: Nov. 3, 2015

(54) MULTI-STAGE NOISE SHAPING ANALOG-TO-DIGITAL CONVERTER

(71) Applicant: ANALOG DEVICES TECHNOLOGY, Hamilton (BM)

(72) Inventors: Yunzhi Dong, Toronto (CA); Hajime Shibata, Toronto (CA); Wenhua W. Yang, North Andover, MA (US); Richard E. Schreier, Toronto (CA)

(73) Assignee: Analog Devices Global, Hamilton (BM)

( * ) Notice: Subject to any disclaimer, the term of this patent is extended or adjusted under 35 U.S.C. 154(b) by 2 days.

(21) Appl. No.: 14/057,153

(22) Filed: Oct. 18, 2013

(65) Prior Publication Data

US 2015/0109158 A1 Apr. 23, 2015

(51) Int. Cl.
| | |
|---|---|
| H03M 3/00 | (2006.01) |
| H03M 1/00 | (2006.01) |
| H03M 1/12 | (2006.01) |
| H04L 25/06 | (2006.01) |
| H04M 1/725 | (2006.01) |
| H03M 1/14 | (2006.01) |

(52) U.S. Cl.
CPC .............. *H03M 3/344* (2013.01); *H03M 1/00* (2013.01); *H03M 1/12* (2013.01); *H03M 1/144* (2013.01); *H03M 1/145* (2013.01); *H03M 3/30* (2013.01); *H03M 3/416* (2013.01); *H04L 25/067* (2013.01); *H04M 1/72519* (2013.01)

(58) Field of Classification Search
CPC ........... H03M 3/30; H03M 1/12; H03M 1/10; H04L 25/067; H04M 1/72519
USPC .................. 341/143, 155, 156, 110; 375/340; 455/550.1
See application file for complete search history.

(56) References Cited

U.S. PATENT DOCUMENTS

| | | |
|---|---|---|
| 2005/0083220 A1 | 4/2005 | Siferd et al. |
| 2008/0150776 A1* | 6/2008 | DiGiandomenico et al. . 341/143 |
| 2010/0331039 A1* | 12/2010 | Hezar ........................ 455/550.1 |

FOREIGN PATENT DOCUMENTS

EP 2863547 4/2015

OTHER PUBLICATIONS

"Higher-Order Delta-Sigma Modulation," (hard-bound book), pp. 126-137.
Lucien J. Breems et al., "A Cascaded Continuous-Time Σ Δ Modulator With 67-dB Dynamic Range in 10-MHz Bandwidth," IEEE Journal of Solid-State Circuits, vol. 39, No. 12, Dec. 2004, pp. 2152-2160.

(Continued)

*Primary Examiner* — Joseph Lauture
(74) *Attorney, Agent, or Firm* — Patent Capital Group (57) ABSTRACT

The present disclosure describes an improved multi-stage noise shaping (MASH) analog-to-digital converter (ADC) for converting an analog input signal to a digital output signal. In particular, a full delta-sigma ($\Delta\Sigma$) modulator is provided at the front-end of the MASH ADC, and another full $\Delta\Sigma$ modulator is provided at the back-end of the MASH ADC. The front-end $\Delta\Sigma$ modulator digitizes an analog input signal, and the back-end $\Delta\Sigma$ modulator digitizes an error between the output of the front-end $\Delta\Sigma$ modulator and the (original) analog input signal. In this configuration where the back-end modulator digitizes the error of the (full) front-end modulator, some design constraints of the front-end are relaxed. These design constraints include thermal noise, digital noise cancellation filter complexity (the quantization noise of the front-end is already shaped by the noise transfer function of the front-end), and/or non-linearity.

24 Claims, 7 Drawing Sheets

(56) References Cited

OTHER PUBLICATIONS

Lucien J. Breems et al., "A 56 mW Continuous-Time Quadrature Cascaded Σ Δ Modulator with 77 dB DR in a Near Zero-IF 20 MHz Band," IEEE Journal of Solid-State Circuits, vol. 42, No. 12, Dec. 2007, pp. 2696-2705.

Yun-Shiang Shu et al., "LMS-Based Noise Leakage Calibration of Cascaded Continuous-Tie Δ Σ Modulators," IEEE Journal of Solid-State Circuits, vol. 45, No. 2, Feb. 2010, pp. 368-379.

N. Maghari et al., "Sturdy MASH Δ-ΣModulator," Electronics Letters, Oct. 26, 2006, vol. 42, No. 22, 2 pages.

Nima Maghari et al., "74 dB SNDR Multi-Loop Sturdy-MASH Delta-Sigma Modulator Using 35 dB Open-Loop Opamp Gain," IEEE Journal of Solid-State Circuits, vol. 44, No. 8, Aug. 2009, pp. 2212-2221.

Ahmed Gharbiya et al., "A 12-Bit 3.125 MHz Bandwidth 0-3 MASH Delta-Sigma Modulator," IEEE Journal of Solid-State Circuits, vol. 44, No. 7, Jul. 2009, pp. 2010-2018.

European Patent Search issued in EP Patent Application Serial No. 14188331.4 mailed May 18, 2015, 9 pages.

Saiya Ren et al., "1GS/s Pipelined Delta Sigma Modulator ADC Using Residue Averaging Technique", Analog Integr Circ Sig Process (2008) 54:31-44, DOI 10.1007/s10470-007-9116-y, Received: Feb. 16, 2007/Revised: Aug. 28, 2007/Accepted: Oct. 17, 2007/ Published online: Nov. 14, 2007 © Springer Scient+Business Media, LLC 2007, 14 pages.

\* cited by examiner

Combining Digital Filters:
$DF1(z)/DF2(z) = G*STF2(z)$

MULTI-STAGE NOISE SHAPING ANALOG-TO-DIGITAL CONVERTER

TECHNICAL FIELD OF THE DISCLOSURE

The present disclosure relates generally to analog-to-digital converters and, more particularly, to improving performance of analog-to-digital converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, in a mobile device receiver, an antenna generates an analog signal based on the electromagnetic waves carrying information/signals in the air. The analog signal generated by the antenna is then provided as input to an ADC to generate a digital output signal for further processing.

Analog-to-digital converters (ADCs) based on delta-sigma ($\Delta\Sigma$) modulation (referred to herein as "$\Delta\Sigma$ modulators" or "$\Delta\Sigma$ ADCs" interchangeably) have been widely used in digital audio and high precision instrumentation systems. $\Delta\Sigma$ modulators usually provides the advantage of being able to convert an analog input signal to a digital signal with high resolution at low cost. Typically, a $\Delta\Sigma$ ADC encodes an analog signal using a $\Delta\Sigma$ modulator (e.g., using a low resolution ADC such as a 1-bit ADC, Flash ADC, Flash quantizer etc.) and then, if applicable, applies a digital filter to the output of the $\Delta\Sigma$ modulator to form a higher-resolution digital output. A loop filter may be provided to provide error feedback the $\Delta\Sigma$ modulator. One key characteristic of a $\Delta\Sigma$ modulator is its ability to push the quantization noise to higher frequencies, also referred to as noise shaping. As a result, $\Delta\Sigma$ ADCs are generally able to achieve high resolution analog-to-digital conversion. Due to its popularity, many variations on the $\Delta\Sigma$ ADC and structures employing the $\Delta\Sigma$ ADC have been proposed.

Overview

The present disclosure describes an improved multi-stage noise shaping (MASH) analog-to-digital converter (ADC) for converting an analog input signal to a digital output signal. In particular, a full delta-sigma ($\Delta\Sigma$) modulator is provided at the front-end of the MASH ADC, and another full $\Delta\Sigma$ modulator is provided at the back-end of the MASH ADC. The front-end $\Delta\Sigma$ modulator digitizes an analog input signal, and the back-end $\Delta\Sigma$ modulator digitizes an error between the output of the front-end $\Delta\Sigma$ modulator and the (original) analog input signal. In this configuration where the back-end modulator digitizes the error of the (full) front-end modulator, some design constraints of the front-end are relaxed. These design constraints include thermal noise, digital noise cancellation filter complexity (the quantization noise of the front-end is already shaped by the noise transfer function of the front-end), and/or non-linearity.

DESCRIPTION OF EXAMPLE EMBODIMENTS OF THE DISCLOSURE

Different variations on the $\Delta\Sigma$ ADC have been proposed to achieve various advantages suitable for a variety of systems. Some $\Delta\Sigma$ ADCs have been concerned with power, while some other $\Delta\Sigma$ ADCs are concerned with complexity. Some $\Delta\Sigma$ ADCs have been concerned with precision, i.e., control over errors and/or noise. For example, for applications with an emphasis on noise shaping, a higher order $\Delta\Sigma$ modulator may be used, i.e., more integrators and feedback paths are used in the loop filter for shaping the quantization noise further out to even higher frequencies.

One group of structures have been proposed for $\Delta\Sigma$ ADCs—multi-stage noise shaping (MASH) ADCs—having a front-end and a back-end where inputs to each modulator differ, and/or the implementation of the stage may differ. While providing multiple stages increases complexity and cost of a $\Delta\Sigma$ ADC, some have remarkable performance. However, many of these MASH ADC structures still suffer from various shortcomings. For instance, some MASH ADCs suffer from high sensitivity to coefficient errors (e.g., coefficients used in one or more feedback paths, which may be optimized for a certain bandwidth or input signal). In order to reduce sensitivity to coefficient errors, a higher-order front-end modulator may be used. For stability reasons, a feedback style front-end topology is may be preferred. Then a tough trade-off exists between the number of orders and the low integrator gain in the front-end. As a result, in order to use a higher-order front-end, one has to burn excessive amount of power in the front-end to achieve the same thermal noise target as compared to the case of using a lower-order front-end.

Others has tried to use a 0-X MASH style ADC to tackle the problem. A 0-X MASH uses a 0th order flash ADC (i.e., no loop filter) as a front-end to provide an initial quantization on the analog input. A delta-sigma modulator in the back-end is used to digitize the error of the entire front-end. The issue with a 0-X MASH ADC is that it highly prefers to employ a feed-forward back-end modulator to reduce its sensitivity to coefficient errors. This causes stability issues to the system especially for large out-of-band signals. Another concern with the 0-X MASH ADC is that it has a flash quantizer/ADC attached to its input which adds additional capacitive loading to the input and may cause signal-dependent kick-back errors.

The improved MASH topology (referred herein as "zoom-MASH" or "ZMASH") avoids this trade off as the thermal noise and linearity of the front-end is cancelled on the 1st order. As a result, one has the opportunity to use higher order feedback style front-end and back-end modulators. In a continuous-time implementation, the proposed ZMASH may even have an Automatic Gain Control (AGC) function by changing its input resistors like any other continuous-time $\Delta\Sigma$ modulator.

For low-over sampling ratio (OSR) $\Delta\Sigma$ systems, a MASH topology is favorable to a single-stage high-order system because the inevitable low integrator gain. However, in order to reduce the sensitivity to coefficient errors, even a MASH prefers a higher order front-end which results in the same issue. The disclosed ZMASH avoids that problem by using front-end stage minimally impacted by thermal noise to process the large input signal voltage while the back-end stage can be designed with relaxed integrator gain due to its reduced full scale thanks to the large full scale scaling factor (inter-stage gain).

The following sections describe various shortcomings of some MASH topologies.

Figure 1:
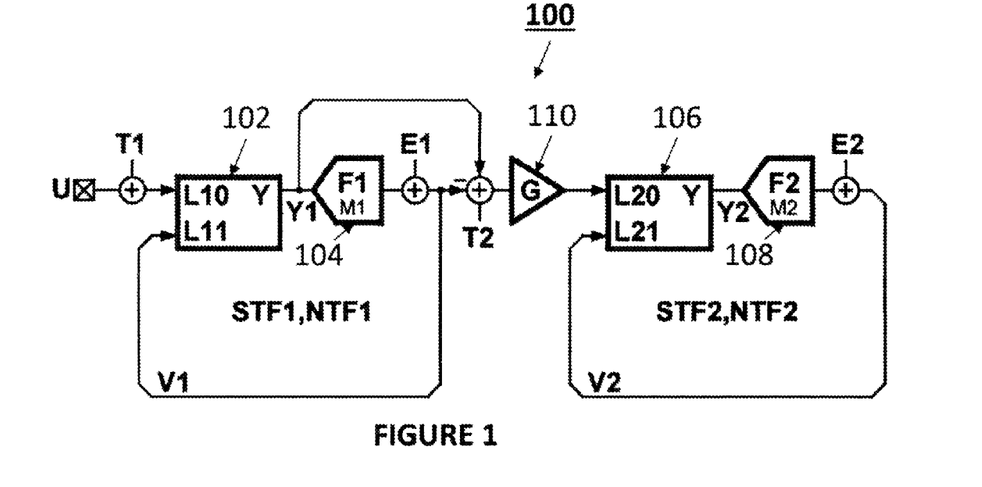
FIG. 1 shows a simplified schematic diagram illustrating a two-stage MASH ADC.

Two-Stage MASH ADC with Back-End Digitizing the Error of Flash Quantizer of the Front-End FIG. 1 is simplified schematic diagram illustrating a two-stage MASH ADC 100. The front-end stage contains a loop filter 102 (depicted having inputs L10 and L11 and output Y) and a flash quantizer with M1 steps F1 104 (e.g., a low-resolution, or 1-bit flash ADC). The loop filter takes analog input signal U (at input L10) and digital feedback signal V1 (at input L11) and generates an output signal Y1 (at output Y). The flash quantizer F1 104 has M1 steps and digitizes Y1 into a digital output V1 and adds quantization noise E1. The back-end stage also contains a loop filter 106 and a flash quantizer F2 108 with M2 steps. The back-end takes the difference between Y1 and V1 and digitizes it into V2. The final output V can be derived from V1 and V2 through the use of a noise cancellation filter (NCF).

In FIG. 1, the gain block G 110 stands for the inter-stage gain between the front-end stage and the back-end stage. The gain of gain block G 110 is also called full scale (FS) scaling factor and is the ratio between the full scale of the front-end and the back-end. As the back-end only processes the quantization error of flash quantizer F1 104, its full scale can potentially be made as small as 1/M1 of the full scale of the front-end. This reduces the quantization noise E2 and improves the overall signal-to-quantization-noise ratio (SQNR) of the MASH ADC 100. T1 and T2 in FIG. 1 represent input-referred thermal noise of the front-end and the back-end stages, respectively. The inter-stage gain G does not help to reject/cancel the thermal noise of the back-end stage.

The digital flash outputs V1 and V2 can be expressed as:

$$V1 = STF1*(U+T1)+NTF1*E1$$

$$V2 = STF2*G(-E1+T2)+NTF2*E2$$

STF1 is the signal transfer function of the front-end stage. NTF1 is the noise transfer function of the front end stage. STF2 is the signal transfer function of the back-end stage, and NTF2 is the signal transfer function of the back-end stage. (These terms are used consistently herein throughout the disclosure.)

Here it is assumed that E2 is measured in terms of the scaled up full scale of the back-end stage. When V1 and V2 are summed to generate the final output V, V2 will have to be scaled down by inter-stage gain G and thus E2 will be scaled down as well. This reflects that with the quantizer with the same number of conversion steps, a reduced full scale in the back-end stage reduces its quantization noise E2 accordingly. The final output V can be formed by adding V1 to V2 through the use of digital noise cancellation filters (NCF) STF2d and NTF1d:

$$V = V1*STF2d + \frac{V2}{G}*NTF1d$$

$$= STF1*STF2d*(U+T1)+STF2*NTF1d*T2+$$

$$(NTF1*STF2d - STF2*NTF1d)E1+NTF2*NTF1d*E2$$

The first term is the input U with input-referred thermal noise T1 from the front-end. The second term is the shaped input-referred thermal noise of the back-end. The third term (in bold) is the leakage of the quantization noise E1 into the final output. When (noise cancellation filters, NCF) NTF1d/STF2d matches NTF1/STF2, the E1 term will vanish. The last term is the quantization noise E2 which is shaped by the product of NTF2 and NTF1d. As indicated in the equation above, the MASH topology is sensitive to coefficient errors as well as timing errors of both the modulators as these errors could affect analog NTF1 and STF2. If NTF1d is denoted as NTF1(1+$\Delta$1) and STF2d is denoted as STF2(1+$\Delta$2), the leakage term from E1 can be rewritten as:

$$\text{Leakage}=NTF1*STF2*(\Delta2-\Delta1)*E1$$

$\Delta$1 and $\Delta$2 are the relative error factors for NTF1 and STF2. As indicated in the equation above, a higher-order front-end stage may have a more aggressive NTF1 and thus be less sensitive to coefficient errors.

To reduce coefficient sensitivity, MASH desires a higher-order front-end stage. However, with a higher-order feedback-style front-end stage in a low-OSR system, the gain of the first integrator will be very low which requires significantly more power for other integrators inside the front-end modulator. Other consideration that limits the order of the front-end modulator is its blocker tolerance. A higher-order front-end stage would be more sensitive to large out-of-band blocker signals. Once the front-end is saturated the back-end will be saturated as well. This is generally true for all MASH topologies.

Sturdy MASH (SMASH) without Digital Noise Cancellation Filter

Figure 2:
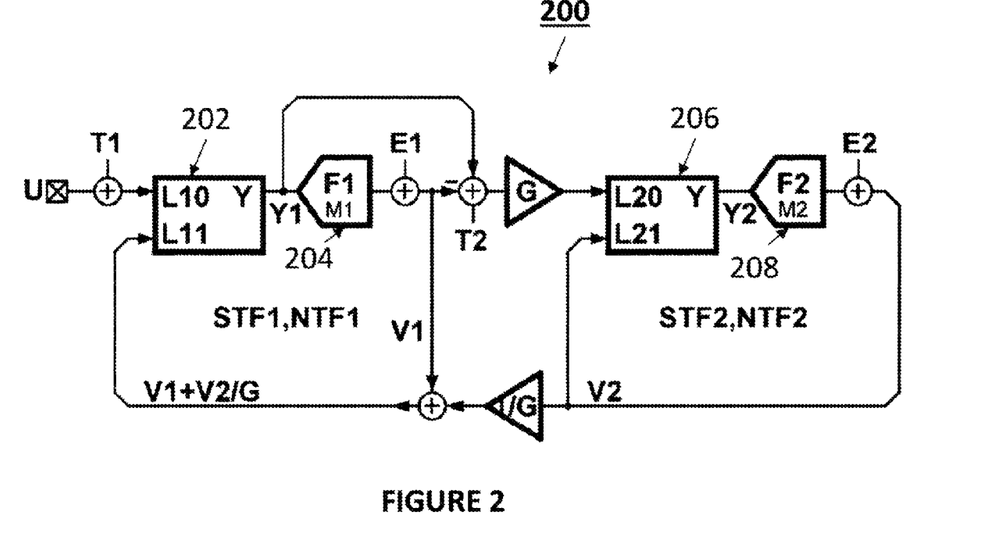
FIG. 2 shows a simplified schematic diagram illustrating a two-stage Sturdy MASH ADC.

FIG. 2 is a simplified schematic diagram illustrating a two-stage Sturdy MASH (SMASH) ADC 200. It is similar to the MASH shown in FIG. 1 as it also contains a front-end stage (with loop filter 202, flash quantizer F1 204) and a back-end stage (with loop filter 206, flash quantizer F2 208). The back-end stage digitizes the quantization error of the flash quantizer F1 204 inside the front-end stage. The difference here is that V2, the digital output of the back-end stage, is also fed to the input of the front-end stage. The loop equations for V1 and V2 can be written as following:

$$(U+T1)L10 + \left(V1 + \frac{V2}{G}\right)L11 + E1 = V1$$

$$(-E1+T2)G*L20 + V2*L21 + E2 = V2$$

V1 and V2 can be derived using superposition (treating V2 as an input to the front-end):

$$V1 = STF1*(U+T1) + NTF1*E1 - (1-NTF1)\frac{V2}{G}$$

$$V2 = STF2*G(-E1+T2) + NTF2*E2$$

The SMASH topology can employ a back-end modulator ensuring that its NTF2 is equal to 1−STF2. With such assumptions, one can simply add V1 to V2/G to obtain the final output V without any noise cancellation filter (NCF):

$$V = V1 + \frac{V2}{G}$$

$$= STF1*(U+T1) + NTF1*E1 - (1-NTF1)\frac{V2}{G} + \frac{V2}{G}$$

$$= STF1(U+T1) + NTF1*E1 + NTF1*STF2(-E1+T2) +$$

$$NTF1*NTF2*\frac{E2}{G}$$

$$= STF1(U+T1) + STF2*NTF1*T2 + NTF1(1-STF2)E1 +$$

$$NTF1*NTF2*\frac{E2}{G}$$

$$= STF1(U+T1) + STF2*NTF1*T2 + NTF1*NTF2\left(E1 + \frac{E2}{G}\right)$$

As indicated above, without any digital noise cancellation filter, the total quantization noise is the sum of E1 and E2/G shaped by the product of NTF1 and NTF2 (denoted above in bold). This is the main benefit of SMASH. However, as E1 is usually much higher than E2/G, the total quantization noise will be limited by the shaped E1. In other words, one has lost the benefit of using the inter-stage gain G to reduce the overall quantization noise. In addition, the SMASH topology tends to use a feedforward (FF) back-end stage as it always has its STF=1−NTF. A FF back-end exhibits peaking STF which could degrade the stability and blocker tolerance of the system.

In some SMASH topologies, a back-end stage with direct input signal feed-forward (meaning a connection from input to the quantizer) is used to realize a STF2=1. Such that the V becomes:

$$V = STF1(U+T1) + STF2*T2 + NTF1(1-STF2)E1 +$$

$$NTF1*NTF2*\frac{E2}{G}$$

$$= STF1(U+T1) + STF2*T2 + NTF1*NTF2\frac{E2}{G}$$

With STF2=1, the E1 term vanishes in the final output. One can obtain the same benefit of a conventional MASH without any digital filters. However, how to implement these direct input feed-forward in a CT modulator remains an issue. For low-OSR systems, any phase/delay error in STF2 could lead to a leakage from NTF1*E1.

SMASH with Digital Noise Cancellation Filter (NCF)

In general SMASH can be implemented with feedback style front-ends and back-ends. In this case the STF2 is not necessarily equal to 1−NTF2. Thus in order to obtain a meaningful output V, a digital noise cancellation filtering (NCF) may be used:

$$V = V1*NCF + \frac{V2}{G}$$

$$= STF1*NCF(U+T1) + NTF1*NCF*$$

$$E1 - NCF*(1-NTF1)\frac{V2}{G} + \frac{V2}{G}$$

$$= A*(U+T1) + B*(T2) + C*E1 + D*E2$$

Where coefficients A-D are:

$A$=STF1*NCF $B$=(−NCF+NCF*NTF1+1)STF2

$C$=NTF1*NCF−(1+NTF1*NCF−NCF)STF2

$D$=(−NCF+NCF*NTF1+1)NTF2

In order to force coefficient C to zero, NCF has to be:

$$NCF = \frac{STF2}{NTF1 + STF2 - NTF1*STF2}$$

This NCF is close to unity in the signal band but not exact, and its sensitivity to coefficient errors does not seem to be better than a regular MASH.

Special Case: 0-X MASH

Figure 3:
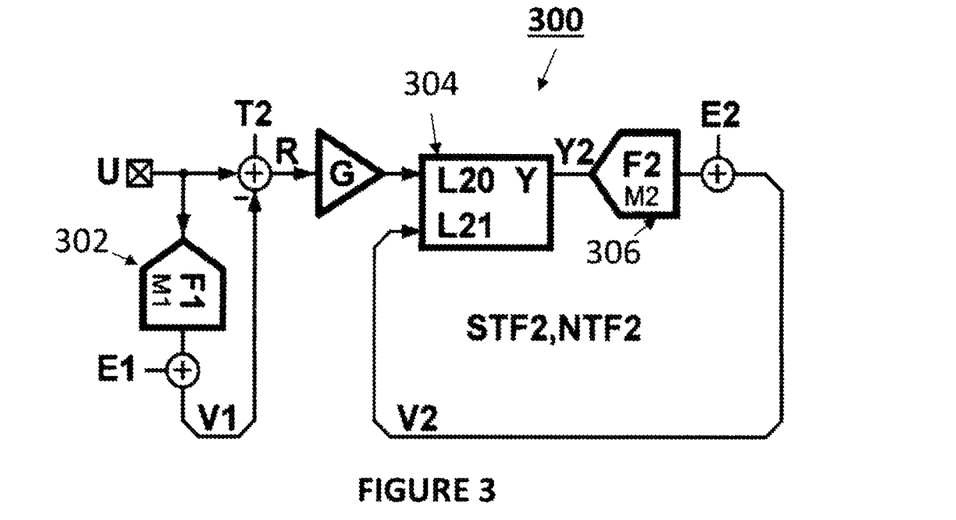
FIG. 3 shows a simplified schematic diagram illustrating a special case of the two-stage MASH ADC.

The special case 0-X MASH can be thought as a special case of SMASH with NTF1 and STF1 equal to unity. FIG. 3 is a simplified schematic diagram illustrating a special case of the two-stage MASH ADC 300. The front end has no loop filter (i.e., no integrators and error feedback loops) and just a flash quantizer F1 302. The back-end has a loop filter 304 and a flash quantizer F2 306. The final digital output V can be easily obtained by summing V1 and V2/G with a NCF derived for the general SMASH structure. A NTF1 of unity is convenient in this case and the desired NCF is STF2. If we denote the noise cancellation filter (NCF) as STF2d:

$$V = V1*STF2d + \frac{V2}{G}$$

$$= STF2d*U + STF2d*E1 + \frac{V2}{G}$$

$$= STF2d*U + STF2d*E1 + STF2(-E1+T2) + NTF2\frac{E2}{G}$$

$$= STF2d*U + STF2*T2 + (STF2d - STF2)E1 + NTF2\frac{E2}{G}$$

$$= STF2d*U + STF2*T2 + \Delta2*STF2*E1 + NTF2\frac{E2}{G}$$

The leakage term from E1 (denoted in bold) is directly proportional to the accuracy of STF2d. A feedback style back-end modulator could have its STF vary 1~2% which would leads to a leakage of E1 attenuated by 40 dB. This is often unacceptable for designs that target 80 dB DR with low OSRs. However, the 0-X FB MASH could be useful for systems shooting for 60~70+ dB DR with moderate OSRs.

One benefit with a feedback style back-end is its enhanced blocker tolerance. In addition, a higher-order feedback style back-end does not face the usual low integrator gain issue as the inter-stage gain G helps to relax that by a factor of 4 to 8.

0-X Feedforward (FF) MASH

Figure 4:
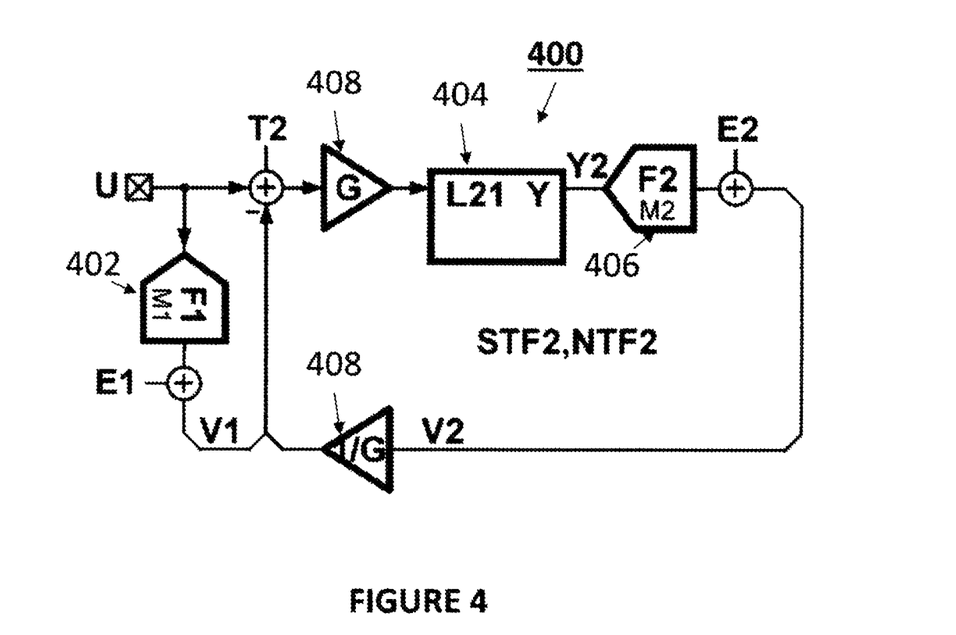
FIG. 4 shows a simplified schematic diagram illustrating a two-stage MASH ADC which is a special case of the two-stage ADC of FIG. 3.

The 0-X MASH modulator could benefit from a feedforward back-end stage the same way as a SMASH modulator. FIG. 4 is a simplified schematic diagram illustrating another two-stage MASH ADC 400 (a special case of the ADC 300 in FIG. 3). The front end has no loop filter (i.e., no integrators and error feedback loops) and just a flash quantizer F1 402. The back-end has a loop filter 404 and a flash quantizer F2 406. In a feedforward configuration, the output V2 of the back-end is not provided directly to the loop filter 404. Rather, the output V2 goes through gain block 1/G and the output of gain block 1/G 408 is summed with U and T2. With a feed-forward back-end stage, STF2 will be equal to 1−NTF2. Thus by simply summing V1 and V2/G, we obtain:

$$V = V1 + \frac{V2}{G} = U + E1 + \frac{V2}{G} = U + STF2 * T2 + NTF2\left(E1 + \frac{E2}{G}\right)$$

Thus, both the quantization noise of E1 and E2/G will be shaped by NTF2. The more aggressive NCF approach can also be applied towards a 0-X FF MASH with NCF set to STF2d:

$$V = V1 * STF2d + \frac{V2}{G}$$
$$= STF2d * U + STF2d * E1 + \frac{V2}{G}$$
$$= STF2d * U + STF2 * T2 + (STF2d - STF2)E1 + NTF2\frac{E2}{G}$$
$$= STF2d * U + STF2 * T2 + \Delta 2 * STF2 * E1 + NTF2\frac{E2}{G}$$

Comparing to a 0-X FB MASH, the STF2 of a feed-forward back-end stage will vary much less and thus the system is less sensitive to coefficient errors.

Improved MASH ADC: Zoom-MASH (ZMASH)

Figure 5:
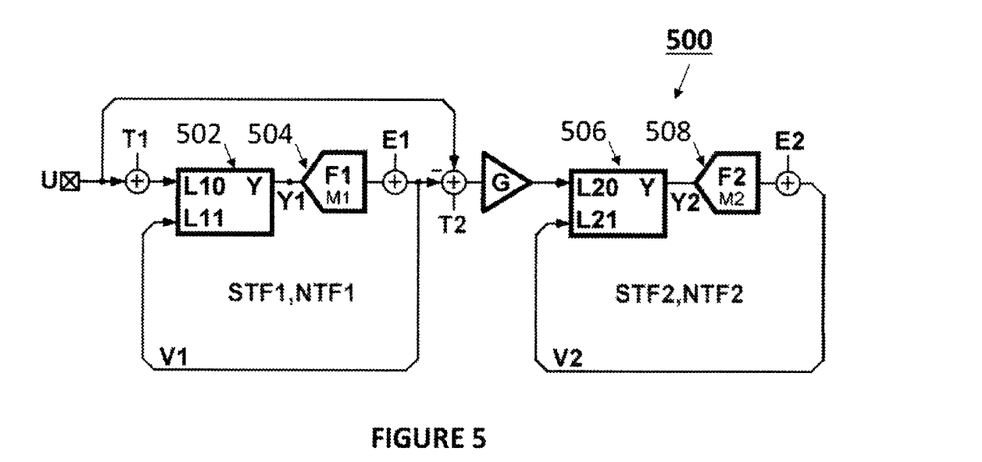
FIG. 5 shows a simplified schematic diagram illustrating an improved MASH ADC, according to some embodiments of the disclosure.

While the above MASH topologies can achieve reasonable performance, the present disclosure proposes a further improved MASH topology which alleviates at least some of the shortcomings these MASH topologies. FIG. 5 is a simplified schematic diagram illustrating an improved MASH ADC 500, according to some embodiments of the disclosure. The MASH ADC for converting an analog input signal to a digital output signal has a front-end stage and a back-end stage. The front-end stage comprises a (full) delta-sigma modulator, having loop filter 502 and flash quantizer F1 504, for digitizing the analog input signal U to produce a first intermediate digital output signal V1, and the back-end stage comprises a (full) delta-sigma modulator, having loop filter 506 and flash quantizer F2 508, for digitizing an error between the analog input signal U and the first intermediate digital output signal V1 (error=U−V1) to produce a second intermediate digital output signal V2. A (final) digital output signal V of the MASH ADC is produced from the first intermediate digital output signal V1 and the second intermediate digital output signal V2. For instance, V1 and V2 may be summed and/or filtered (e.g., noise cancellation filter NCF) to produce V (e.g., using a digital signal processor).

The residual fed to the back-end stage is no longer the quantization error of the quantizer F1 in the front-end stage anymore (in contrast to the two-stage MASH ADC with back-end digitizing the error of flash quantizer of the front-end). Rather, the residual fed to the back-end stage is the error of the whole front-end (including the loop filter 502 and flash quantizer F1 502). The residual here is the error of the entire front-end stage. Thus, the entire MASH behaves like two-step ADC where the back-end zooms into the least significant bits (LSBs) of the front-end and digitizes the residual error of the front-end. Another way of looking at ZMASH is that it is similar to a 0-X MASH where the front-end F1 is replaced by a complete modulator, however, with advantages.

If we assume a perfect delay in the signal U feed-forward path, the digital outputs can be written as:

$$V1 = STF1(U + T1) + NTF1 * E1 + IMD1$$
$$V2 = STF2 * G(U - V1 + T2) + NTF2 * E2$$
$$= STF2 * G((1 - STF1)U - STF1 * T1 - NTF1 * E1 - IMD1) + NTF2 * E2$$

Here IMD1 stands for the nonlinear distortion term generated in V1 due to nonlinearity in the front-end stage. The final digital output V can be formed through a noise cancelling filter (NCF) equal to STF2d:

$$V = V1 * STF2d + \frac{V2}{G}$$
$$= V1 * STF2d - V1 * STF2 + STF2(U + T2) + NTF2\frac{E2}{G}$$
$$= (STF1(U + T1) + NTF1 * E1 + IMD1)(STF2d - STF2) +$$
$$STF2(U + T2) + NTF2\frac{E2}{G}$$

As indicated in the equation above, ideally ZMASH has an output that has a signal component (U+T2) with a quantization noise from the back-end modulator shaped by NTF2. The leakage term from the front-end stage is proportional to the difference between STF2d and STF2. Assuming the matching between STF2 and STF2d can be made as small as 1% (−40 dB rejection), the front-end stage can be designed to have a relaxed requirement on its quantization/thermal noise as well as linearity. Generally speaking, ZMASH exhibits first-order cancellation for one or more of the following: thermal noise of the front-end delta-sigma modulator, non-linearity of the front-end delta-sigma modulator, and quantization noise of the delta modulator shaped by a noise transfer function of the front-end delta-sigma modulator.

In order to have a relatively large inter-stage gain G, the front-end STF1 may be matched to unity in the signal band (or equivalently the input feed-forward gain has to match the STF1). Small errors such as 1~2% in STF1 does not cause serious stability issues as the back-end full scale can be designed to have extra margin. For example, the full scale of the back-end will be 12.5% of the front-end full scale with an inter-stage gain G of 8.

Figure 6:
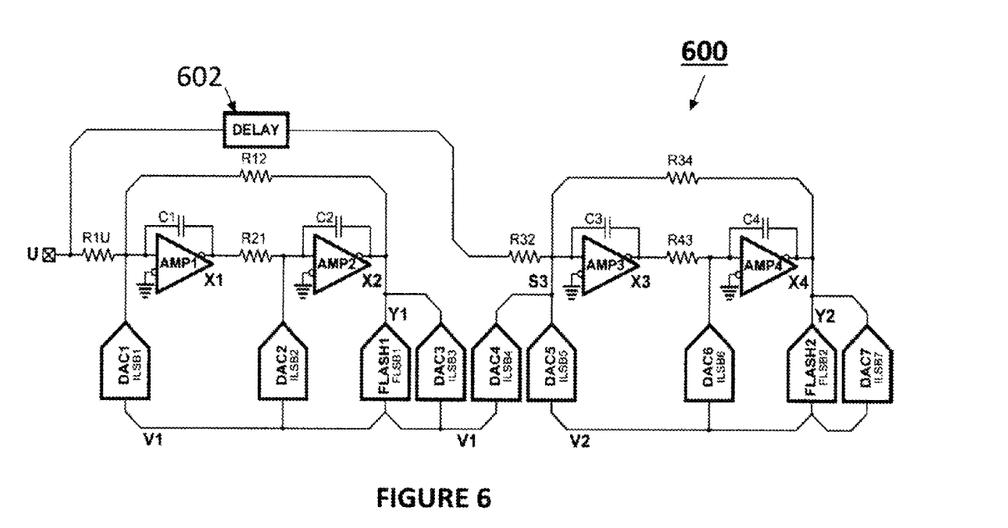
FIG. 6 shows a simplified schematic diagram illustrating an exemplary implementation of the improved MASH ADC, according to some embodiments of the disclosure.

FIG. 6 is a simplified schematic diagram illustrating an exemplary implementation of the improved MASH ADC, according to some embodiments of the disclosure. Specifically, FIG. 6 shows a 2-2 ZMASH ADC 600 where the feed-forward path is realized with a delay and a resistor R32. In a continuous-time (CT) implementation of a ZMASH ADC, that the delay block 602 for providing the analog input signal U to the back-end stage for generating the error of the front-end stage in FIG. 6 may have to match both its gain and phase response with the signal path in front-end modulator and DAC4. This involves some fixed delay as well as the continuous-time STF1 response and the DAC response. This could potentially be done with passive R-C delay and low-pass filtering structure or L-C lattice delay structure. When compared to the two-stage MASH ADC with back-end digitizing the error of flash quantizer of the front-end and SMASH, the difference between ZMASH is that E2 is only shaped by NTF2 thus the back-end may need to be a higher-order modulator for a certain signal-to-quantization-noise ratio target.

To further elaborate on the advantages of ZMASH, the performance of ZMASH is compared with other MASH topologies in the application scenario of a low-OSR high-speed continuous-time ADC inside low intermediate frequency (IF) base station receivers. The main advantage of the proposed ZMASH comparing to various other MASH topologies is that it utilizes a (full) modulator front-end to process the large input signal and provides a moderately accurate digitization. The entire front-end error is further digitized by a feedback style back-end stage. The large inter-stage gain G helps the thermal noise-power trade-off in the feedback style back-end stage where the thermal noise matters. The thermal noise of the front-end does not really matter STF2 variation and potential flash kick-back at the input. The ZMASH can also implement auto gain control (AGC) functions as regular MASH/SMASH. ZMASH does not have any specific requirement on the type of modulators in the front-end or back-end and its front-end quantization noise E1 is ideally cancelled similar to a MASH and 0-X MASH. The main disadvantage of ZMASH is that the quantization noise of the back-end modulator is only shaped by NTF2. Thus for a targeted SQNR, ZMASH may employ a higher-order back-end modulator stage. In addition, A ZMASH also needs an input attached delay line similar to the 0-X MASH. This could potentially lead to a frequency-dependent input impedance. However, with passive delay and low pass filter (LPF) structures, the input impedance of the delay line is expected to be stable and controlled in the signal band and decreases at high frequencies. Assuming the front-end stage can absorb the high-frequency reflections, the decreasing input impedance of the ADC at high frequencies provides extra blocker rejection.

Table 1 briefly compares the three MASH topologies against the proposed ZMASH topology for the application inside a low-OSR ADC for low intermediate frequency (IF) base-station receiver

TABLE 1

Comparison of the four MASH topologies

|  | 0-X FF MASH | 1-2 FB MASH | 2-2 SMASH | 2-4 ZMASH |
| --- | --- | --- | --- | --- |
| Front-end | $0^{th}$ FLASH | $1^{st}$ order FB | $2^{nd}$ order FB | $2^{nd}$ order FB |
| Back-end | $4^{th}$ order FF | $2^{nd}$ order FB | $2^{nd}$ order FF | $4^{th}$ order FB |
| Mode | BP | LP | BP | BP |
| OSR | 16 | 8 | 16 | 16 |
| Inter-stage Gain | 4 | 8 | 8 | 8 |
| NCF | STF2 | STF2/NTF1 | N.A. | STF2 |
| Quantization Noise (QN) | NTF2*E2/G | NTF1d*NTF2*E2/G | NTF1*NTF2*(E1 + E2/G) | NTF2*E2/G |
| M1 steps | 32 | 16 | 16 | 16 |
| M2 steps | 16 | 16 | 16 | 16 |
| Thermal Noise | T2 | T1 + T2*NTF1 | T1 + T2*NTF1 | T2 |
| Leakage E1 | E1*STF2*Δ2 | E1*NTF1*STF2*(Δ1 + Δ2) | E1*NTF1*NTF2 | E1*NTF1*STF2*Δ2 |
| Δ = 1% Leakage E1* | Low | High | Moderate | Very Low |
| Estimated Power | Low | Moderate | High | Low |
| AGC | N.A. | R1U | R1U | R1U & R32 |
| Dither F1 | Hard | Easier | Easier | Easier |
| Out of Band Blocker Tolerance (OBT) | Bad | Good | Bad | Moderate |
| Delay | Input | Embedded | Embedded | Input |

*The STF of the 0-4 FF MASH is much less likely to have 1% variation comparing to other MASH topologies.

and thus it can be designed with low integrator gain. This is similar to a 0-X FB MASH. The relaxed requirement on linearity for the front-end can be further exploited to reduce its complexity and power consumption. With a higher-order NTF1, the leakage from the front-end quantization noise is not an issue.

In comparison, MASH/SMASH also desire a higher-order front-end to improve their robustness to coefficient variations. However, as thermal noise of the front-end matters in MASH/SMASH, they face serious trade-off between power and modulator orders. This trade-off does not exist for ZMASH. A ZMASH can have a small, simple, and low-power third-order front-end stage and still achieves low thermal noise overall.

To sum up, the ZMASH can have thermal noise efficiency similar to a 0-X Feedback MASH without sensitivity issue to Variations of ZMASH: Feedback and Feedforward Configurations Generally speaking, a feedforward modulator has lower power consumption for the same thermal noise requirement due to their high front-end gain feature. Thus in applications where power consumption is important and less out-of-band blocker signals are expected, feedforward modulators will be preferred. In some special cases, such as in a 0-X MASH ADC, the stable STF in the signal band is another reason for favoring a feedforward modulator. In contrast, feedback modulators are preferred in applications where large out-of-band blocker signals are expected, such as communication systems. The low-pass like STF of a feedback modulator will help to attenuate out-of-band blocker signals and maintain stability.

Either or both the front-end stage and the back-end stage may be configured with a feedback or a feedforward configuration (or a hybrid of both), depending on the particular application and desired characteristics of the ZMASH ADC. A feedforward modulator generally has only one feedback DAC path to the very front of the loopfilter but multiple feedforward paths from integrator outputs to the input of the Flash quantizer. As a result, a modulator having a feedforward configuration generally has a higher front-end gain, a more stable STF in the signal band, with a peaking STF behavior out-of-band. In contrast, a modulator with a feedback configuration comprises multiple feedback DAC paths into the loopfilter and exhibits a low-pass like STF without peaking. Feedback modulator generally has a lower front-end gain and a STF that is more sensitive to component parameter variations.

In some embodiments, the front-end delta-sigma modulator is configured in a feedback configuration (e.g., the first intermediate digital output signal V1 as seen in FIG. 5 in a feedback configuration in the front-end delta-sigma modulator), and the back-end delta-sigma modulator is configured in a feedforward configuration (e.g., the error of the front-end modulator is provided in a feedforward configuration in the back-end delta-sigma modulator). In this way, one of the digital combing coefficient in the noise cancellation filter becomes easier to implement as the STF for the feedforward backend modulator varies much less comparing to a feedback style modulator. In addition, the feedforward back-end also provides a higher front-end gain which helps to improve thermal noise-power trade-off.

In some embodiments, the front-end delta-sigma modulator is configured in a feedforward configuration (e.g., the analog input signal U as seen in FIG. 5 is provided in a feedforward configuration in the front-end delta-sigma modulator) and the back-end delta-sigma modulator is configured in a feedback configuration (e.g., the second intermediate digital output signal V2 as seen in FIG. 5 is provided in a feedback configuration in the back-end delta-sigma modulator). Using a feedforward front-end modulator makes the task of matching magnitude response of the signal U delay path and the front-end STF easier.

In some other embodiments, both the front-end delta-sigma modulator and the back-end delta sigma modulator are configured in a feedback configuration (e.g., the first intermediate digital output signal V1 as seen in FIG. 5 in a feedback configuration in the front-end delta-sigma modulator, and the second intermediate digital output signal V2 is provided in a feedback configuration in the back-end delta-sigma modulator). This type of configuration gives the highest stability and blocker tolerance as both front-end and back-end exhibits low-pass like STFs without peaking.

In certain embodiments, both the front-end delta-sigma modulator and the back-end delta sigma modulator are configured in a feedforward configuration (e.g., the analog input signal U as seen in FIG. 5 is provided in a feedforward configuration in the front-end delta-sigma modulator, and the error of the front-end modulator is provided in a feedforward configuration in the back-end delta-sigma modulator). The feedforward back-end modulator relaxes the digital filter design with a stable STF, and the number of feedback DACs also gets reduced significantly as both front-end and back-end are feedforward modulators.

Variations of ZMASH: Continuous-Time and Discrete-Time Configurations

Either or both the front-end stage and the back-end stage may have a continuous-time implementation or a discrete-time implementation, depending on the particular application and desired characteristics of the ZMASH ADC. Generally speaking, discrete-time delta-sigma modulators and continuous-time delta-sigma modulators share the same building blocks. However, the characteristics of the loop filter distinguish one from the other. Discrete-time delta-sigma modulators use a discrete-time loop filter, typically implemented with switched-capacitor circuits. On the other hand, continuous-time delta-sigma modulators employ a continuous-time loop filter, which may be implemented with gm-C, active RC, LC, or other filtering elements.

In some embodiments, the front-end delta-sigma modulator has a continuous-time loop filter (e.g., providing the analog input signal U as seen in FIG. 5 as an input to a continuous-time loop filter of the front-end delta-sigma modulator), and the back-end delta-sigma modulator has a discrete-time loop filter (e.g., providing the error of the front-end modulator as an input to a discrete-time loop filter of back-end delta-sigma modulator). In some lower speed, high accuracy applications, it is easier to have an accurate discrete-time back-end that only needs to have a small full-scale range.

In some embodiments, the front-end delta-sigma modulator has a discrete-time loop filter (e.g., providing the analog input signal U as seen in FIG. 5 as an input to a discrete-time loop filter of the front-end delta-sigma modulator), and the back-end delta-sigma modulator has a continuous-time loop filter (e.g., providing the error of the front-end modulator as an input to a continuous-time loop filter of back-end delta-sigma modulator). In this case, the advantage of using a continuous-time back-end is that it has a higher power efficiency over discrete-time implementations where the thermal noise counts.

In some other embodiments, both the front-end delta-sigma modulator and the back-end delta sigma modulator have a continuous-time loop filter configuration (e.g., providing the analog input signal U as seen in FIG. 5 as an input to a continuous-time loop filter of the front-end delta-sigma modulator, and providing the error of the front-end modulator as an input to a continuous-time loop filter of back-end delta-sigma modulator). This configuration suites the high-speed applications where both front-end and back-end needs to be fast. This is the inherent advantage of continuous-time modulators over discrete-time modulators. Plus, the front-end could be a smaller copy of the back-end which saves implementation time.

In certain embodiments, both the front-end delta-sigma modulator and the back-end delta sigma modulator have a discrete-time loop filter (e.g., providing the analog input signal U as seen in FIG. 5 as an input to a discrete-time loop filter of the front-end delta-sigma modulator, and providing the error of the front-end modulator as an input to a discrete-time loop filter of back-end delta-sigma modulator). A fully discrete-time implementation has the advantage of easier-to-control coefficient and thus higher accuracy. This could be an attractive solution for some low-speed, high-accuracy applications.

Variations of ZMASH: Higher-Order Delta-Sigma Modulators

The front-end stage and the back-end stage may have a first-order, second-order, or higher order implementation, depending on the particular application and desired characteristics of the ZMASH ADC. Generally speaking, the number of integrators, and consequently, the numbers of feedback loops in the loop filter, indicates the order of a delta-sigma modulator. First order modulators are unconditionally stable, but stability analysis must be performed for higher order modulators.

In some embodiments, the front-end delta-sigma modulator is a first-order delta-sigma modulator. In some embodiments, the back-end delta-sigma modulator is a first-order delta-sigma modulator. In some embodiments, the front-end delta-sigma modulator is a second-order delta-sigma modulator. In some embodiments, the back-end delta-sigma modulator is a second-order delta-sigma modulator. In some embodiments, the front-end delta-sigma modulator is a third-order or higher delta-sigma modulator. In some embodiments, the back-end delta-sigma modulator is a third-order or higher delta-sigma modulator. In some embodiments, the order of the back-end delta-sigma modulator higher order than the front-end delta-sigma modulator. The order of the back-end determines how much noise shaping one has in its NTF. The higher order in the backend, the better noise shaping will be. On the other hand, the order in the front-end only gives some protection over quantization noise leakage from the front-end to back-end, thus a higher-order front-end will be less sensitive to coefficient errors in the digital recombining filters. So for high SNR requirement, the order of the back-end could be higher than the front-end.

Method for Converting Analog Input Signal U to Digital Output Signal V

Figure 7:
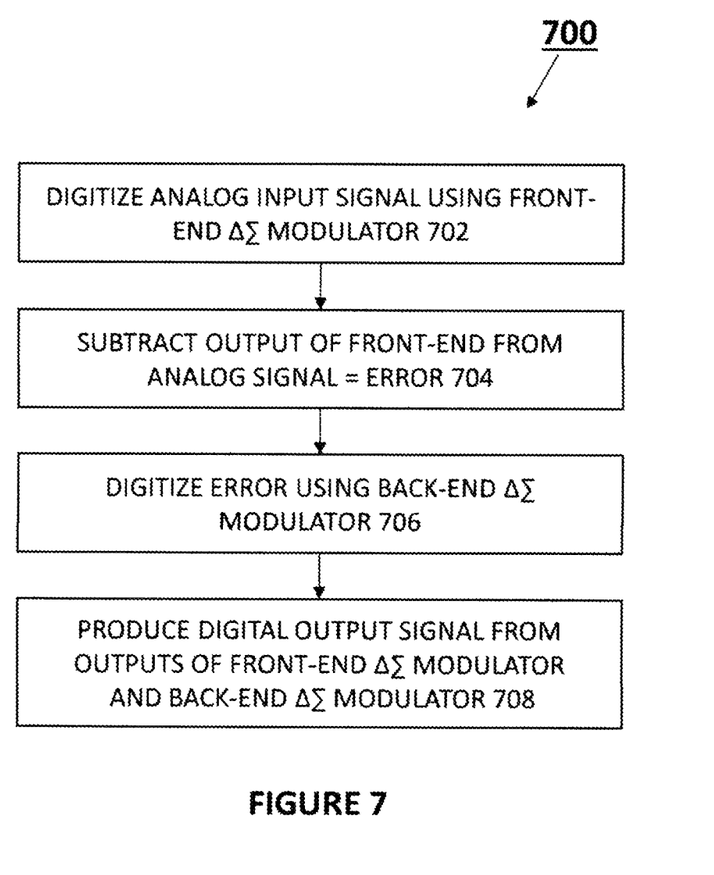
FIG. 7 shows a flow diagram illustrating an exemplary method for converting an analog input signal to a digital output signal using the improved MASH ADC, according to some embodiments of the disclosure.

FIG. 7 is a flow diagram illustrating an exemplary method 700 for converting an analog input signal to a digital output signal using the improved MASH ADC (ZMASH), according to some embodiments of the disclosure. At step 702, the analog input signal (e.g., U, as seen in FIGS. 5 and 6), is provided as input to a front-end delta-sigma modulator for digitizing the analog input signal to produce a first intermediate digital output signal V1 (e.g., V1, as seen in FIGS. 5 and 6). At step 704, the first intermediate digital output signal (e.g., V1, as seen in FIGS. 5 and 6) is subtracted from the analog input signal U to obtain an error of the front-end modulator. At step 706, the error is provided as input to a back-end delta-sigma modulator for digitizing the error to produce a second intermediate digital output signal (e.g., V2, as seen in FIGS. 5 and 6). At step 708, the digital output signal (e.g., V) of the MASH ADC is produced from the first intermediate digital output signal (e.g., V1) and the second intermediate digital output signal (e.g., V2). For instance, the second intermediate digital output signal and the first intermediate digital output signal may be combined/summed to produce the digital output signal using a combining part.

Application of the ZMASH: High Performance Cellular Base Station

Figure 8:
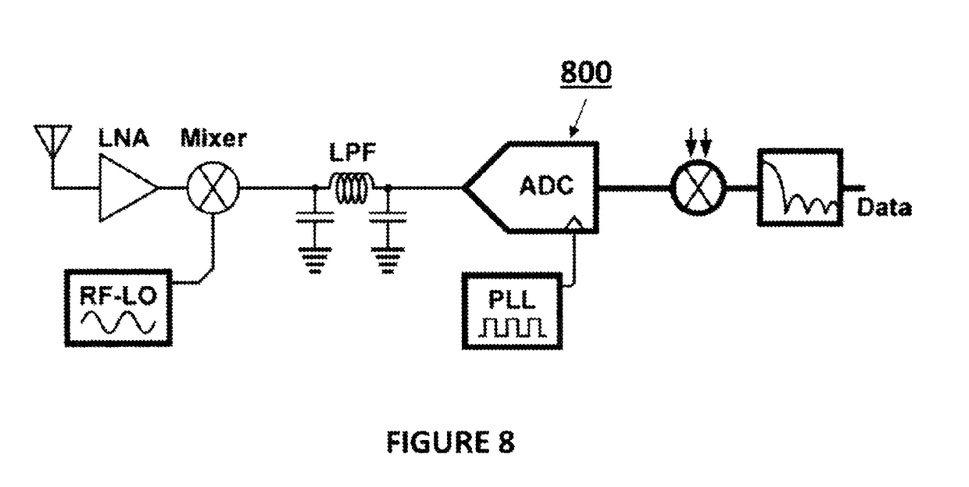
FIG. 8 is a simplified schematic diagram illustrating an exemplary application of the improved MASH ADC, according to some embodiments of the disclosure.

FIG. 8 is a simplified schematic diagram illustrating an exemplary application of the improved MASH ADC (ZMASH), according to some embodiments of the disclosure. One suitable application of the ZMASH is next-generation macro base-station receivers.

Typically the base-station receiver includes one or more antennas for receiving an analog signal in the air. For a multi-band signal, multiple antennas may be used. The analog signal in the air is then provided as the analog input signal to a ZMASH ADC (denoted as, e.g., ADC) in FIG. 8) for converting the analog signal to a digital output signal. In some embodiments, the analog signal is subject to some filtering, such as a low pass filter (denoted as LPF in FIG. 8), e.g., to remove noise or remove undesirable signal components in the analog signal prior to providing the analog signal to a ZMASH ADC (e.g., ADC).

In particular, a front-end delta-sigma modulator is provided in ZMASH for digitizing the analog signal to produce a first intermediate digital output signal, and a back-end delta-sigma modulator is provided in ZMASH for digitizing an error between the analog signal and the first intermediate digital output signal to produce a second intermediate digital output signal. The digital output signal of the MASH ADC is produced from the first intermediate digital output signal and the second intermediate digital output signal.

In some cases, the analog signal in the air is provided to a mixer in conjunction with a phase-locked loop (PLL) control system. Furthermore, the ADCs (e.g., ADC) may also be under the control of the PLL control to keep the digital output signals in phase with each other. The system could also contain supporting circuit modules such as serial-parallel interface (SPI), non-violate memory (NVM), first-in-first-out buffer (FIFO), and ARM processor.

Digital signal processing circuits such as digital filters may be provided for producing the digital output signal from the first intermediate digital output signal and the second intermediate digital output signal of the ZMASH ADC, e.g., through summation and filtering. In some cases, these digital filters are equivalent to noise cancellation filters. In practice, these filters can be implemented using finite impulse response filter (FIR), infinite impulse response filter (IIR) or a combination of both.

Figure 9:
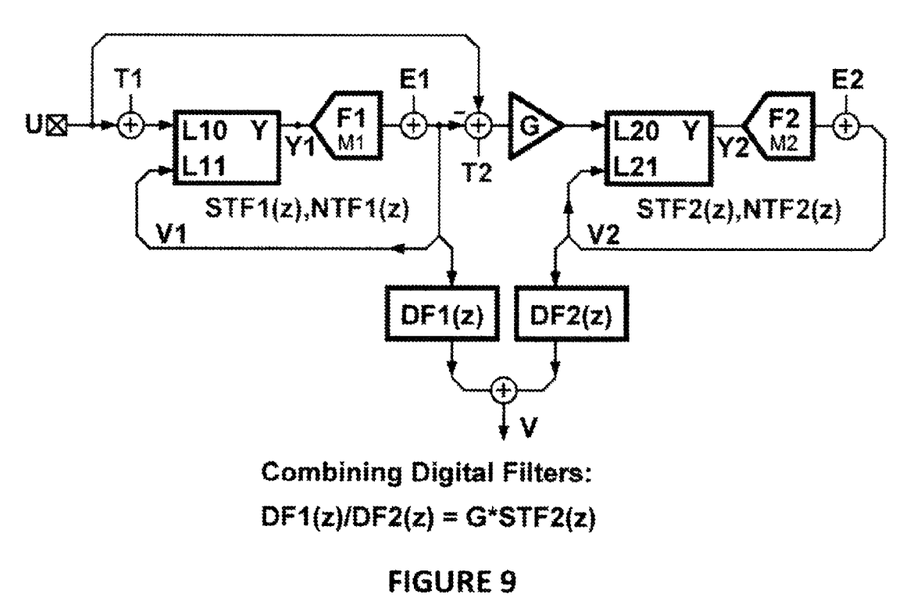
FIG. 9 is a simplified schematic showing the outputs of the front-end modulator and the back-end modulator is combined with two digital filters, according to some embodiments of the disclosure.

FIG. 9 is a simplified schematic showing the outputs of the front-end modulator and the back-end modulator is combined with two digital filters, according to some embodiments of the disclosure.

As shown in FIG. 9, the front-end ADC inside a ZMASH ADC produces digital output V1 while the back-end ADC inside a ZMASH ADC produces digital output V2. V1 and V2 should be combined through the use of digital filters to eliminate quantization noise added by the front-end ADC. The digital combining filters are denoted as DF1(z) and DF2(z). The transfer function of DF1(z) and DF2(z) should match to the signal transfer function of the back-end ADC (STF2(z)) and the inter-stage gain G (also known as full scale scaling factor):

$$DF1(z)/DF2(z)=G*STF2(z)$$

Where G is the inter-stage gain between the front-end and the back-end.

Figure 10:
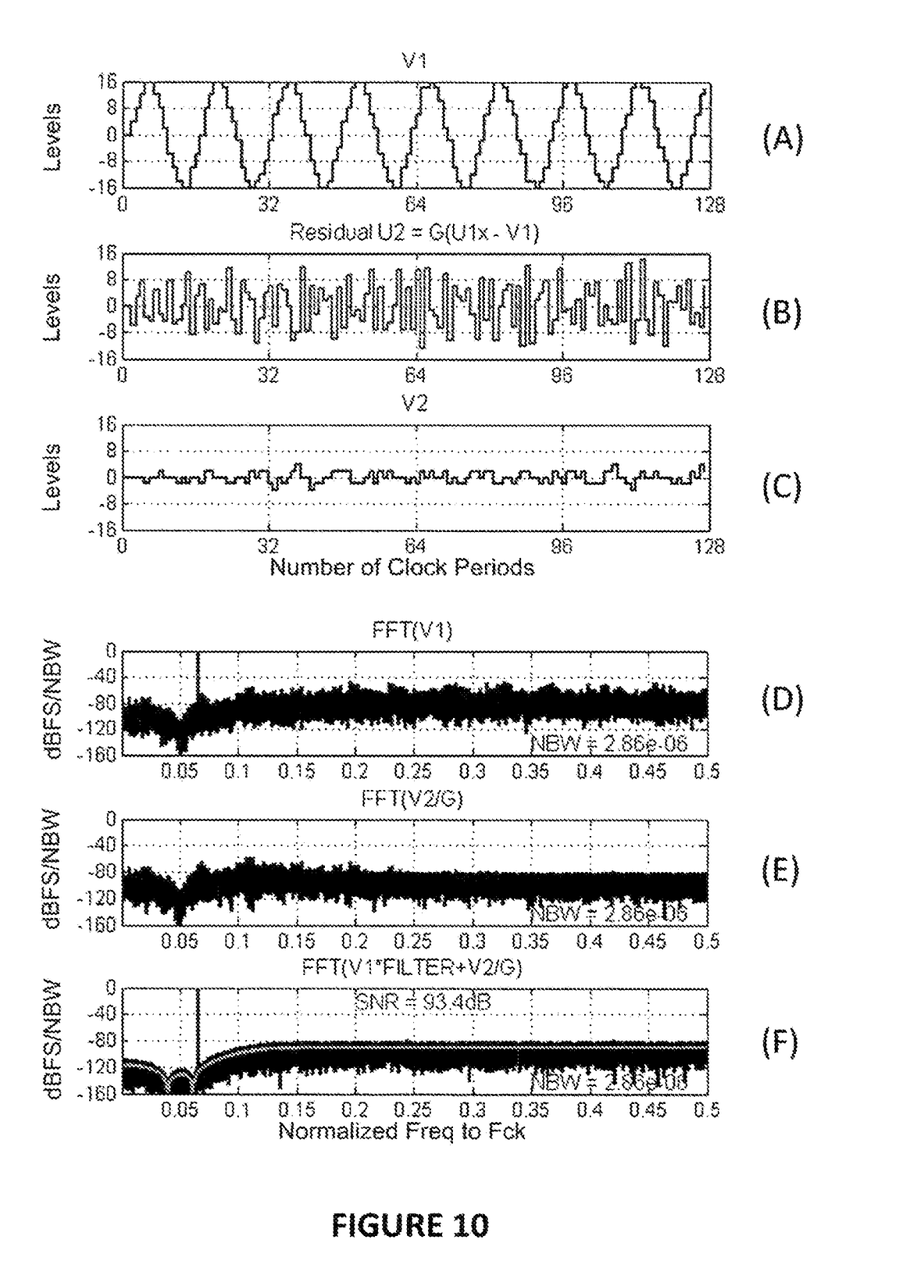
FIG. 10 shows a waveform of an output V1 of a front-end modulator (A), a waveform of a net input to a back-end modulator (B), a waveform of an output V2 of the back-end modulator (C), a spectrum of V1 (D), a spectrum of V2 (E), and a spectrum of a final combined output (F).

FIG. 10 shows a waveform of an output V1 of a front-end modulator (A), a waveform of a net input to a back-end modulator (B), a waveform of an output V2 of the back-end modulator (C), a spectrum of V1 (D), a spectrum of V2 (E), and a spectrum of a final combined output (F). V1 and V2 are combined to form the final output. The combining filter used here has the required response of STF2(z)/G.

In a continuous-time implementation of the proposed ZMASH ADC, the STF2(z) in the equation above has to include additional frequency response of the DAC (e.g., DAC4 in FIG. 6). This could be 1.5 or 0.5 clock periods delay depending on the timing arrangement of V1 relative to V2. If V1 is aligned to V2 with no delay, then STF2(z) in the equation above may include 1.5 clock periods delay.

In the discussions of the embodiments above, the opamps, DACs, ADCs capacitors, clocks, DFFs, dividers, inductors, resistors, amplifiers, switches, digital core, transistors, and/or other components usable for these circuits can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, digital signal processing circuits, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute digital filtering for ADCs. In some cases, the integrated circuits may be configured to execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets where ADCs are used. Other consumer applications can include audio and video processors for home theater systems, DVD recorders, and high-definition televisions. Other audio and high precision instrumentation systems are envisioned.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking, e.g., to sample analog data to provide digital data. The digital data may then be provided the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A multi-stage noise-shaping (MASH) analog-to-digital converter (ADC) for converting an analog input signal to a digital output signal, the MASH ADC comprising:
    a front-end delta-sigma modulator for receiving the analog input signal as input to a loop filter of the front-end delta-sigma modulator and digitizing the analog input signal to produce a first intermediate digital output signal; and
    a back-end delta-sigma modulator for receiving an error of the front-end delta-sigma modulator, wherein the error is a difference between the analog input signal and the first intermediate digital output signal, and digitizing the error to produce a second intermediate digital output signal;
    wherein the digital output signal of the MASH ADC is produced from the first intermediate digital output signal and the second intermediate digital output signal.

2. The MASH ADC of claim 1, further comprising:
    a combining part for combining the second intermediate digital output signal with the first intermediate digital output signal to produce the digital output signal.

3. The MASH ADC of claim 1, wherein:
    the front-end delta-sigma modulator comprises a first loop filter and a first flash quantizer; and
    the back-end delta-sigma modulator comprises a second loop filter and a second flash quantizer.

4. The MASH ADC of claim 1, wherein:
    the front-end delta-sigma modulator is configured in a feedback configuration; and/or
    the back-end delta-sigma modulator is configured in a feedback configuration.

5. The MASH ADC of claim 1, wherein:
    the front-end delta-sigma modulator is configured in a feedforward configuration; and/or
    the back-end delta-sigma modulator is configured in a feedforward configuration.

6. The MASH ADC of claim 1, wherein:
    the front-end delta-sigma modulator has a continuous-time loop filter; and/or
    the back-end delta-sigma modulator has a continuous-time loop filter.

7. The MASH ADC of claim 1, wherein:
    the front-end delta-sigma modulator has a discrete-time loop filter; and/or
    the back-end delta-sigma modulator has a discrete-time loop filter.

8. The MASH ADC of claim 1, wherein the MASH ADC exhibits first-order cancellation for one or more of the following: thermal noise of the front-end delta-sigma modulator, non-linearity of the front-end delta-sigma modulator, and quantization noise of the front-end delta-sigma modulator shaped by a noise transfer function of the front-end delta-sigma modulator.

9. The MASH ADC of claim 1, wherein:
    the front-end delta-sigma modulator is a second-order delta-sigma modulator; and/or
    the back-end delta-sigma modulator is a second-order delta-sigma modulator.

10. The MASH ADC of claim 1, wherein:
    the front-end delta-sigma modulator is a third-order delta-sigma modulator; and/or
    the back-end delta-sigma modulator is a third-order delta-sigma modulator.

11. The MASH ADC of claim 1, further comprising:
    a continuous-time delay for delaying the analog input signal used in generating the error of the front-end delta-sigma modulator.

12. The MASH ADC of claim 11, wherein the continuous-time delay comprises a passive R-C delay and low-pass filtering structure.

13. The MASH ADC of claim 11, wherein the continuous-time delay comprises a L-C lattice delay structure.

14. The MASH ADC of claim 1, wherein:
    the first intermediate digital output signal is processed by a first digital filter;
    the second intermediate digital output signal is processed by a second digital filter; and
    transfer functions of the first digital filter and the second digital filter match a signal transfer function of the back-end delta-sigma modulator and an interstage gain between the front-end delta-sigma modulator and the back-end delta sigma modulator.

15. A method for converting an analog input signal to a digital output signal using a multi-stage noise-shaping (MASH) analog-to-digital converter (ADC), the method comprising:
    receiving the analog input signal as input to a loop filter of a front-end delta-sigma modulator for digitizing the analog input signal to produce a first intermediate digital output signal; and
    subtracting the first intermediate digital output signal from the analog input signal to obtain an error of the front-end delta-sigma modulator; and
    receiving the error as input to a back-end delta-sigma modulator for digitizing the error to produce a second intermediate digital output signal;
    wherein the digital output signal of the MASH ADC is produced from the first intermediate digital output signal and the second intermediate digital output signal.

16. The method of claim 15, further comprising:
    combining the second intermediate digital output signal and the first intermediate digital output signal to produce the digital output signal using a combining part.

17. The method of claim 15, further comprising:
processing the analog input signal by the loop filter and a flash quantizer of the front-end delta-sigma modulator to produce the first intermediate digital output signal.

18. The method of claim 15, further comprising:
processing the error of the front-end delta-sigma modulator by a further loop filter and a flash quantizer of the back-end delta-sigma modulator to produce the second intermediate digital output signal.

19. The method of claim 15, further comprising:
processing the error of the front-end delta-sigma modulator by the back-end delta-sigma modulator to provide first-order cancellation for thermal noise of the front-end delta-sigma modulator.

20. The method of claim 15, further comprising:
processing the error of the front-end delta-sigma modulator to provide first-order cancellation for non-linearity of the front-end delta-sigma modulator.

21. The method of claim 15, further comprising:
processing the error of the front-end delta-sigma modulator to provide first-order cancellation for quantization noise of the front-end delta-sigma modulator shaped by a noise transfer function of the front-end delta-sigma modulator.

22. The method of claim 15, further comprising:
processing, by the back-end delta-sigma modulator, the error of the front-end delta-sigma modulator and not a quantization error of a quantizer of the front-end delta-sigma modulator to reduce design constraint(s) on the front-end delta-sigma modulator and/or the back-end delta-sigma modulator.

23. A cellular base station comprising:
an antenna for receiving an analog signal in the air;
a multi-stage noise-shaping (MASH) analog-to-digital converter (ADC) for converting the analog signal to a digital output signal, the MASH ADC comprising:
a front-end delta-sigma modulator for receiving the analog output signal as input to a loop filter of the front-end delta-sigma modulator and digitizing the analog input signal to produce a first intermediate digital output signal; and
a back-end delta-sigma modulator for receiving an error of the front-end delta-sigma modulator, wherein the error is a difference between the analog input signal and the first intermediate digital output signal, and digitizing the error to produce a second intermediate digital output signal;
wherein the digital output signal of the MASH ADC is produced from the first intermediate digital output signal and the second intermediate digital output signal.

24. The cellular base station of claim 23, further comprising:
digital signals processing circuits for producing the digital output signal from the first intermediate digital output signal and the second intermediate digital output signal.

* * * * *